United States Patent [19]
Wakui

[11] Patent Number: 5,900,707
[45] Date of Patent: May 4, 1999

[54] STAGE-DRIVE CONTROL APPARATUS AND METHOD, AND SCAN-PROJECTION TYPE EXPOSURE APPARATUS

[75] Inventor: Shinji Wakui, Utsunomiya, Japan

[73] Assignee: Canon Kabushiki Kaisha, Tokyo, Japan

[21] Appl. No.: 08/876,754

[22] Filed: Jun. 16, 1997

[30] Foreign Application Priority Data

Jun. 19, 1996 [JP] Japan ................................ 8-158172

[51] Int. Cl.$^6$ .................................................. G05B 11/32
[52] U.S. Cl. ................... 318/625; 318/560; 318/568.17; 318/592
[58] Field of Search ................................. 318/625, 560, 318/568.17, 592; 355/53, 77

[56] References Cited

U.S. PATENT DOCUMENTS

| | | | |
|---|---|---|---|
| 4,132,898 | 1/1979 | Buelow et al. ............................ | 355/53 |
| 4,676,630 | 6/1987 | Matsushita et al. ...................... | 355/53 |
| 5,504,407 | 4/1996 | Wakui et al. ....................... | 318/568.17 |
| 5,511,930 | 4/1996 | Sato et al. ............................... | 414/676 |
| 5,568,032 | 10/1996 | Wakui ...................................... | 318/632 |
| 5,663,783 | 9/1997 | Ueda ......................................... | 355/53 |

FOREIGN PATENT DOCUMENTS

| | | |
|---|---|---|
| 3-282605 | 12/1991 | Japan . |
| 7-29801 | 1/1995 | Japan . |
| 7-319549 | 12/1995 | Japan . |

*Primary Examiner*—Karen Masih
*Attorney, Agent, or Firm*—Fitzpatrick, Cella, Harper & Scinto

[57] ABSTRACT

A scan-projection type exposure apparatus quickly suppresses disturbance in synchronization between a wafer stage and a reticle stage, and enables high-precision pattern exposure. This apparatus employs a master-slave control with a wafer-stage side as the master with a reticle-stage side as the slave, so as to correct a target value of a position control system of a rough-motion stage or that of a position control system of the reticle stage by using motion-mode errors $e_g$, $e\theta_x$ and $e\theta_y$ in a one-to-one correspondence with a disturbance occurring to the rough-motion stage of the wafer stage due to movement of a fine-motion stage of the wafer stage.

16 Claims, 8 Drawing Sheets

STAGE-DRIVE CONTROL APPARATUS AND METHOD, AND SCAN-PROJECTION TYPE EXPOSURE APPARATUS

BACKGROUND OF THE INVENTION

This invention relates to a stage-drive control apparatus and method for simultaneously driving two stages and, more particularly to a scan-projection type exposure apparatus and method which sequentially transfer-exposes a mask pattern on wafers in a slit-scan exposure method in a photolithographic process for manufacturing semiconductor devices, liquid-crystal display devices and the like.

Upon manufacturing semiconductor devices or liquid-crystal display devices by the photolithography process, a projection-exposure apparatus is used to transfer a pattern formed on a reticle onto a wafer to which sensitizer material is applied.

Conventionally, as a projection-exposure apparatus, the so-called step-and-repeat type reduced projection-exposure apparatus operates in many production sites. This apparatus sequentially moves respective areas to be exposed (shot areas) of wafers within an exposure field of an optical projection-exposure system, thus sequentially exposing a reticle pattern image on the respective shot areas. However, the size of semiconductor chips has increased in recent years, and the projection-exposure apparatuses are required to have a large exposure area to transfer-expose larger reticle patterns on wafers. At the same time, in response to micro-miniaturization of semiconductor patterns, the resolution of the reticle must be improved. However, it is technically difficult to design and manufacture a projection-exposure apparatus that has an improved resolution and a large exposure area.

To solve this problem, the so-called scan-projection type exposure apparatus has been developed. This apparatus scans (moves) a reticle with respect to a slit illumination area. The reticle pattern is sequentially exposed on wafers by scanning (moving) the wafers in synchronization with the reticle with respect to an exposure area in conjugation with the illumination area.

FIG. 5 is a cross-sectional view showing the conventional scan-projection type exposure apparatus. In FIG. 5, reference numeral 1 denotes an optical illumination system; 2, exposure light emitted from the optical illumination system 1; 3, a reticle held on a reticle stage 4; 5, an optical projection system; 6, a wafer to which a photoresist is applied; and 7, a wafer stage. The reticle stage 4 and the wafer stage 7 move in the y-axial direction opposite to each other, respectively, at a speed $V_r$ and a speed $V_w$.

A master-slave synchronized control system is known as a control principle for moving the two positioning objects at a fixed speed while maintaining a synchronized relation between the objects. This principle will be briefly described with reference to FIG. 6, which is a block diagram showing the master-slave synchronized control system. In FIG. 6, the relation among values $x_M$, $d_M$, $x_S$, $d_S$ and $r_M$ is represented as follows. Note that $d_M'=0$ holds for the sake of simplification.

$$x_M = \frac{G_M G_{MC}}{1+G_M G_{MC}} r_M + \frac{G_M}{1+G_M G_{MC}} d_M \quad (1)$$

$$x_S = \frac{G_S G_{SC}}{1+G_S G_{SC}} \left[ \frac{G_M G_{MC}}{1+G_M G_{MC}} r_M + \frac{G_M}{1+G_M G_{MC}} d_M \right] \frac{1}{\beta} + \frac{G_S}{1+G_S G_{SC}} d_S \quad (2)$$

$r_M$: target value to master control system
$r_S$: target value to slave control system
$e_M$: positional error of master control system
$e_S$: positional error of slave control system
$G_{MC}(s)$: compensator of master control system
$G_{SC}(s)$: compensator of slave control system
$G_M(s)$: controlled object of master control system
$G_S(s)$: controlled object of slave control system
$d_M$: force-based disturbance to master control system
$d_M'$: displacement-based disturbance to master control system
$d_S$: force-based disturbance to slave control system
$X_M$: displacement output of master control system
$X_S$: displacement output of slave control system
$\beta$: reduction ratio (e.g., 1/4)

In FIG. 6, the dashed-lined block represents a synchronization error $e_{syc}$ as an evaluation index defined by:

$$e_{syc} = X_M - \beta X_S \quad (3)$$

Accordingly, the following relation is obtained by substituting equations (1) and (2) into equation (3):

$$e_{syc} = \frac{G_M G_{MC}}{1+G_M G_{MC}} \frac{1}{1+\frac{G_S G_{SC}}{G_M}} r_M + \frac{1}{1+G_M G_{MC}} \frac{1}{1+G_S G_{SC}} d_M - \frac{\beta G_S}{1+G_S G_{SC}} d_S \quad (4)$$

FIG. 7 shows the meaning of equation (2), i.e., an equivalence block diagram of the master-slave synchronized control system. In FIG. 7, the output $X_M$ of the master control system is multiplied by $1/\beta$ as the target input to the slave control system. The disturbance $d_M$ inputted into the master control system is also transmitted to the slave control system, and as a result, controls the synchronization error $e_{syc}$. On the other hand, the disturbance $d_S$ inputted into the slave control system is used as a disturbance control capability of a closed loop (loop comprising $G_{SC}(s)$ and $G_S(S)$) of the slave control system.

In this master-slave synchronized control system, when the position signal $X_M$ of the master control system fluctuates due to the disturbance $d_M$ applied to the controlled object $G_M(s)$ of the master control system, the positional-error signal $e_M$ of the master control system is inputted into the slave control system via a synchronization correction path 13, with a unit having a $1/\beta$ gain, the slave control system swivels in correspondence with the swivel of the master control system, thus maintaining the synchronized relation between the master and slave control systems. Note that "maintaining the synchronized relation" means setting the synchronization error $e_{syc}$, in the dotted-lined block in FIG. 6, to zero.

As is apparent from the above description, no synchronization correction is performed on the disturbance $d_S$, which is applied to the controlled object $G_S(S)$ of the slave control system, because there is no synchronization correction loop which passes a signal from the slave control system to the master control system. As described above, the disturbance is suppressed only by the disturbance control capability of the slave control system.

Next, a case wherein the wafer stage 7 comprising a fine-motion stage 8 and a rough-motion stage 9 is integrally driven in a negative y-axial direction at a fixed speed will be described with reference to FIG. 8A.

The position signal is detected by irradiating a light beam 10 of a laser interferometer (not shown) by a reflection mirror 11, and the fixed-speed drive is performed based on the detected signal. However, it should be noted that the fine-motion stage 8 is driven by actuators 12M, 12R and 12L and the like on the rough-motion stage 9, and when the fine-motion stage 8 is driven while the rough-motion stage 9 is driven, the reflection mirror 11 for position detection is also moved, which causes a disturbance in the fixed-speed drive.

For example, when the actuator 12M is extended, on the other hand, the actuators 12R and 12L are contracted to tilt the fine-motion stage 8 as shown in FIG. 8B, the rough-motion stage 9, which is being driven at the fixed speed in the negative y-axial direction, instantly causes a disturbance in the scanning speed. In this case, the scanning speed increases. The disturbance is equivalent to the disturbance $d_M'$ (see FIGS. 6 and 7) applied to the master control system, and the master-slave synchronized control system sets the synchronization error to zero by its synchronization correction operation.

Next, a case wherein the actuators 12M, 12R and 12L and the like are expanded by $\Delta Z$ as shown in FIG. 8C will be described. Similar to FIG. 8B, upon expansion of the actuators, when the surface of the reflection mirror 11 for receiving the light beam 10 is tilted from an axis z, the fixed speed drive of the rough-motion stage 9 being driven in the negative y-axial direction is disturbed. Further, it is apparent that when the fine-motion stage 8 is rotated around the axis z by another actuator (not shown), the fixed-speed drive of the rough-motion stage 9 is influenced by the rotation movement of the fine-motion stage 8.

As described above, the z-axial directional translation and the rotations about the x-, y-, and z-axis of the fine-motion stage 8 disturb the fixed-speed drive of the rough-motion stage 9. However, the master-slave control system as shown in FIGS. 6 and 7 controls the synchronization error to zero.

However, the synchronization-error control by the above master-slave control system is relatively slow. Accordingly, to further improve the scan-exposure capability, the synchronization error caused by the disturbance in the fixed-speed drive of the rough-motion stage 9 due to the drive of the fine-motion stage 8, must be quickly suppressed.

Note that Japanese Patent Application Laid-Open Nos. 7-29801 and 3-282605 disclose well-known techniques related to the present invention. Japanese Patent Application Laid-Open No. 7-29801 discloses a hybrid reticle stage having a rough-motion stage and a fine-motion stage. The rough-motion stage, having a speed control system, follows a target scanning speed independently of a wafer stage, while the fine-motion stage, having a position control system, performs synchronization correction. That is, this construction is basically the master-slave synchronized control system wherein the wafer stage serves as a master of the position control system while the reticle stage serves as a slave of the position control system. Further, to speed the response of the reticle stage as the slave, this system feeds-forward the difference between the speed of the wafer stage and that of the reticle stage to the reticle fine-motion stage.

Japanese Patent Application Laid-Open No. 3-282605 discloses a master-slave synchronized control method with speed feedforward function.

However, these techniques lack any means to positively control the displacement-based disturbance.

As described above, in a system which uses a wafer stage and a reticle stage as a master and slave so as to fixed-speed drive the wafer stage and the reticle stage at a fixed speed while maintaining a synchronized relation between them, i.e., a so-called master-slave synchronized control system, the wafer stage receives displacement-based disturbance due to leveling and tilting of a fine-motion stage of the wafer stage. This disturbance can be controlled by a loop structure of the master-slave synchronized control system.

When force-based disturbance such as $d_M$ and $d_S$ are inputted, the response is mitigated by mechanical systems such as $G_M(s)$ and $G_S(s)$, and appear as displacement outputs. On the other hand, the displacement-based disturbance such as $d_M'$ is not mitigated and directly appears in the displacement output, which seriously influences the synchronization control capability. Accordingly, the scan-projection type exposure apparatus is required to quickly suppress the disturbance in the synchronization between the wafer stage and the reticle stage caused by the displacement-based disturbance.

SUMMARY OF THE INVENTION

The present invention has been made in consideration of the above situation, and has as its object to provide a stage-drive control apparatus and method which drives two stages in synchronization with each other and quickly suppresses disturbance in the synchronization between the stages due to displacement-based disturbance.

Another object of the present invention is to provide a scan-projection type exposure apparatus, which quickly suppresses a disturbance in synchronization between a wafer stage and a reticle stage and thus enables high-precision pattern exposure.

According to one aspect of the present invention, the first object is attained by providing a stage-drive control apparatus. The apparatus includes a first moving device for moving a first stage based on a given target value. A second moving device moves a second stage in synchronization with movement of the first stage by the first moving device. A controller controls displacement of a third stage, provided on the first stage, with respect to the first stage. A correction device corrects a control signal of the first moving device and/or the second moving device, based on a control signal for the third stage received from the controller.

According to another aspect of the present invention, the foregoing objects are attained by a stage-drive control method. In a first moving step, a first stage is moved based on a given target value. In a second moving step, a second stage is moved in synchronization with the movement of the first stage in the first moving step. A control step controls displacement of a third stage, which is provided on the first stage. The movement is controlled with respect to the first stage. A correction step corrects a control signal of the first moving step and/or the second moving step, based on a control signal for the third stage, which is generated in the control step.

The foregoing objects are also attained, according to yet another aspect of the present invention, by a scan-projection type exposure apparatus having a reticle stage which scan-moves a reticle in a predetermined direction, and a wafer stage which scan-moves a wafer in synchronization with movement of the reticle stage, with respect to an exposure area in conjugation with an illumination area on the reticle. The apparatus projects a circuit pattern on the reticle onto the wafer. The apparatus includes a first moving device for controlling movement of a rough-motion stage of the wafer stage and a second moving device for moving the reticle stage in synchronization with movement of the wafer stage. A position controller positions a fine-motion stage, provided in the wafer stage, carrying the wafer, at a predetermined degree of freedom. A correction device corrects a target value of the first moving device and/or the second moving device, based on a control amount with respect to the fine-motion stage by the position controller.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such an example, however, is not exhaustive of the various embodiments of the invention, and therefore, reference is made to the claims, which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

Figure 7:
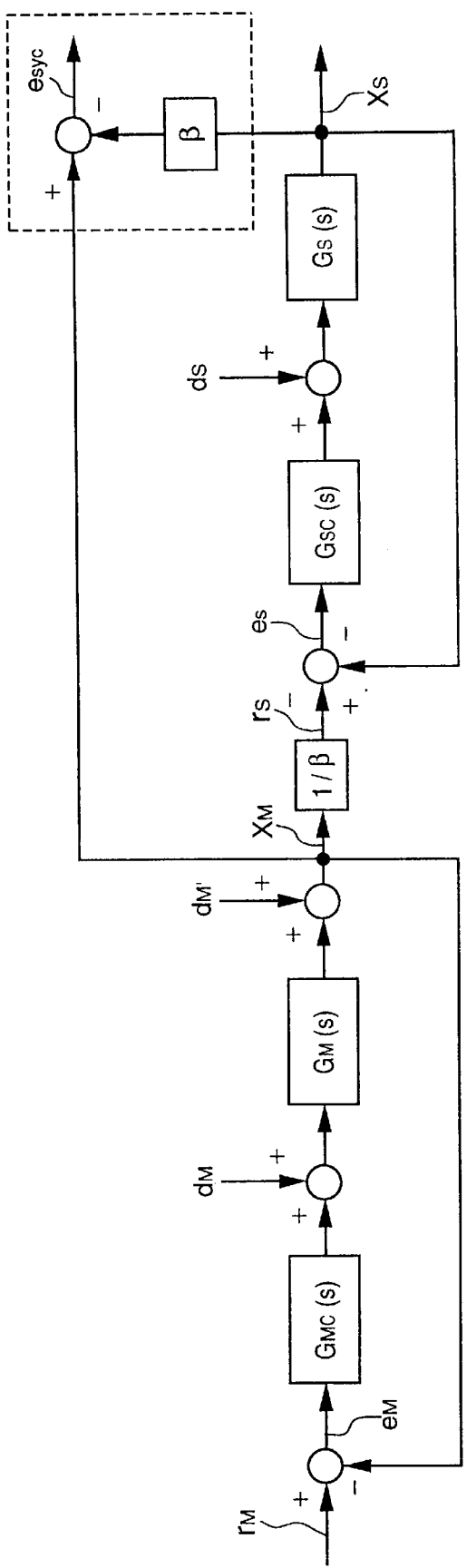
Figure 8A:
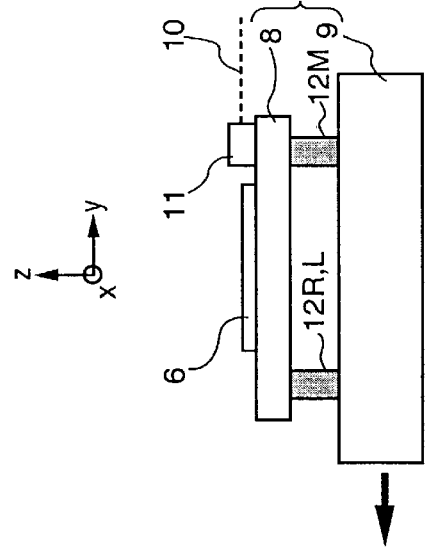
FIGS. 8A to 8C are cross-sectional views showing a fixed-speed drive of a wafer stage.
Figure 8B:
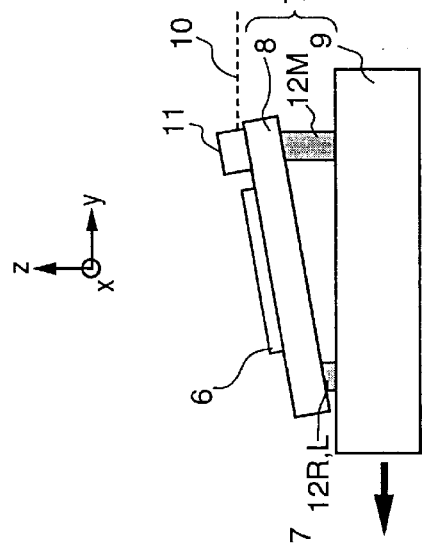
Figure 8C:
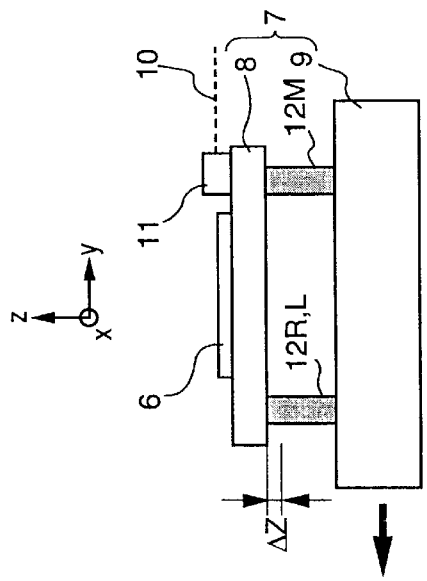

Again referring to FIG. 7, the principle of the present invention will be described as a preparatory step for specific embodiments. In FIG. 7, the displacement output $x_M$ is obtained after the disturbance $d_M'$ is added to the output from the controlled object $G_M(s)$. The output $x_M$ is derived from displacement. Therefore, the disturbance $d_M'$ is a displacement-based disturbance. The reflection mirror 11 for monitoring the position signal used for driving the rough-motion stage 9 is provided on the fine-motion stage 8. The disturbance received by the rough-motion stage 9 due to a drive of the fine-motion stage 8, is the displacement-based disturbance $d_M'$.

It should be noted that the disturbance is classified into a predictable disturbance and an unpredictable disturbance. The disturbance treated in the present invention is displacement-based predictable disturbance, as described above, and it has an apparent cause-and-effect relation, i.e., it is caused by driving the fine-motion stage.

Figure 1:
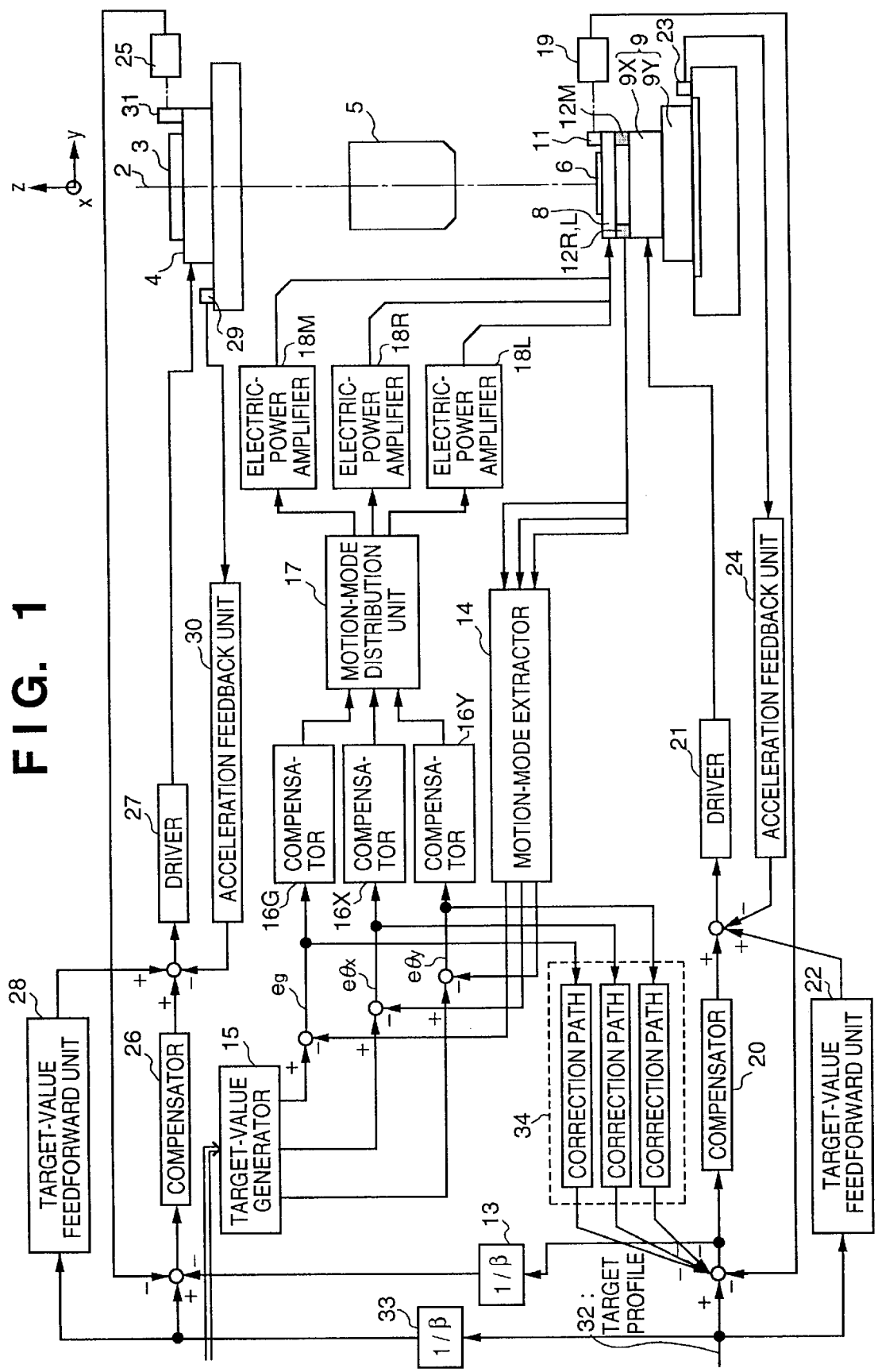
FIG. 1 is a block diagram showing the construction of a scan-projection type exposure apparatus according to a first embodiment of the present invention.
Figure 2:
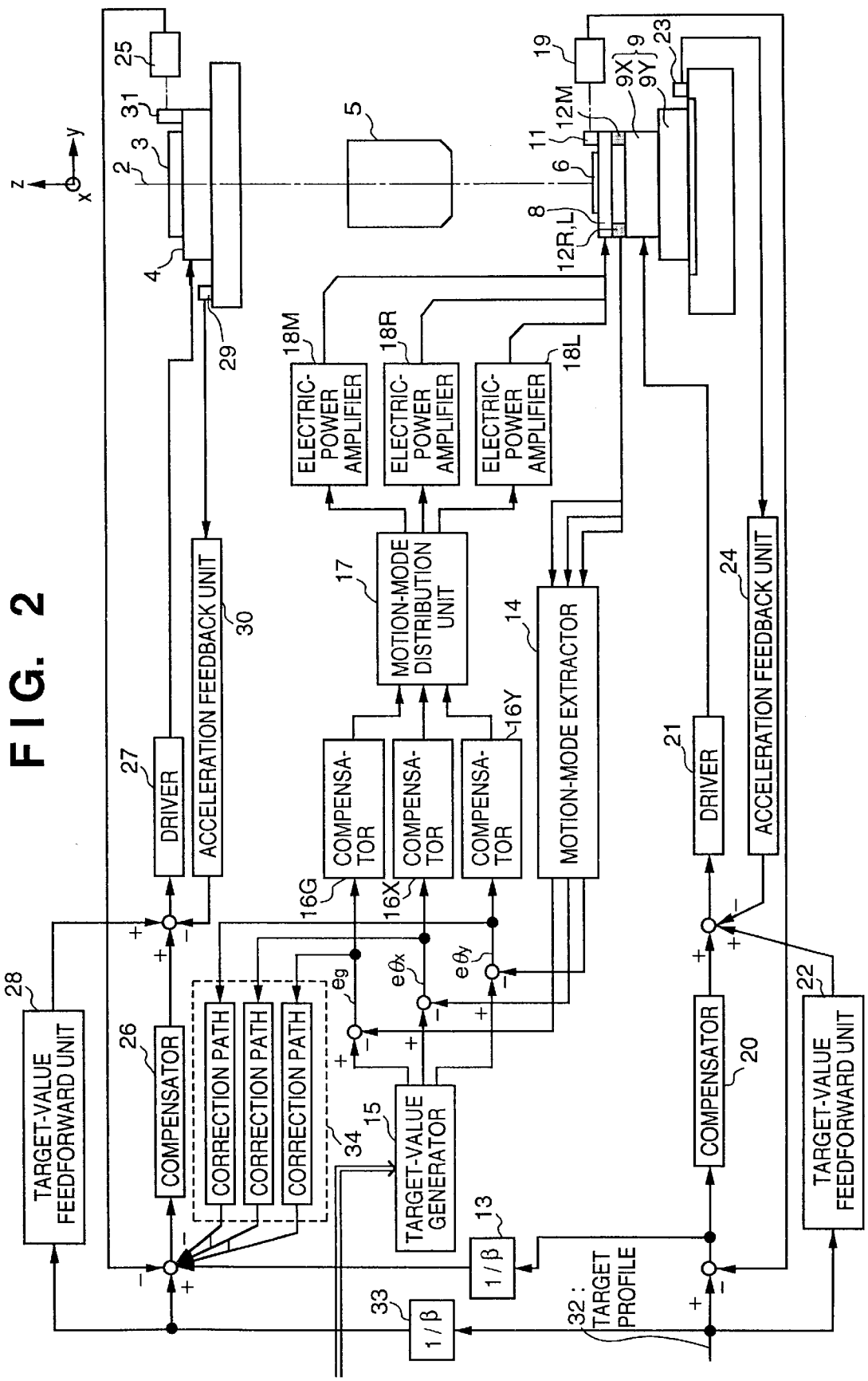
FIG. 2 is a block diagram showing the construction of the scan-projection type exposure apparatus according to a second embodiment of the present invention.
Figure 3:
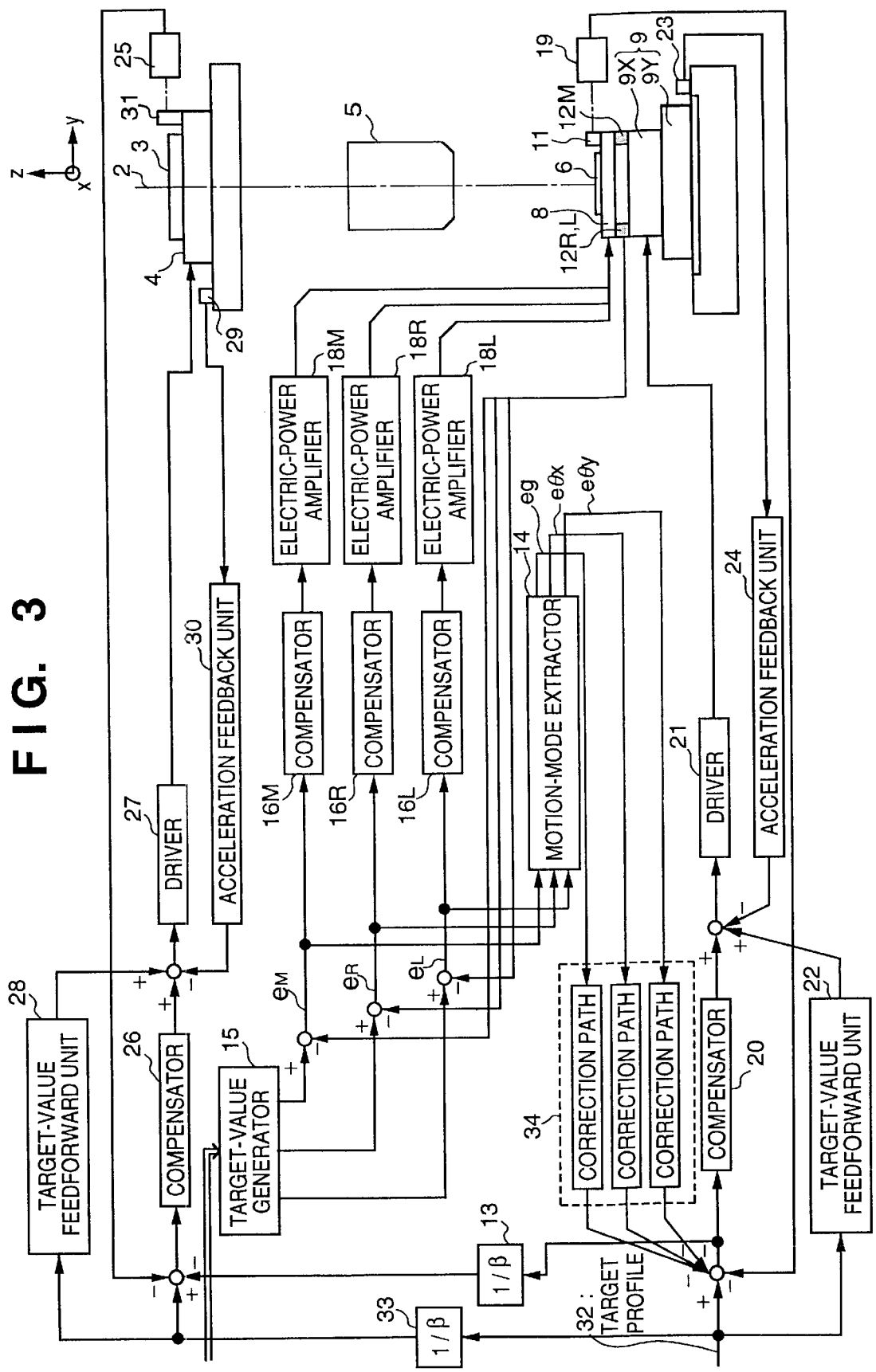
FIG. 3 is a block diagram showing the construction of the scan-projection type exposure apparatus according to a modification of the first embodiment.
Figure 4:
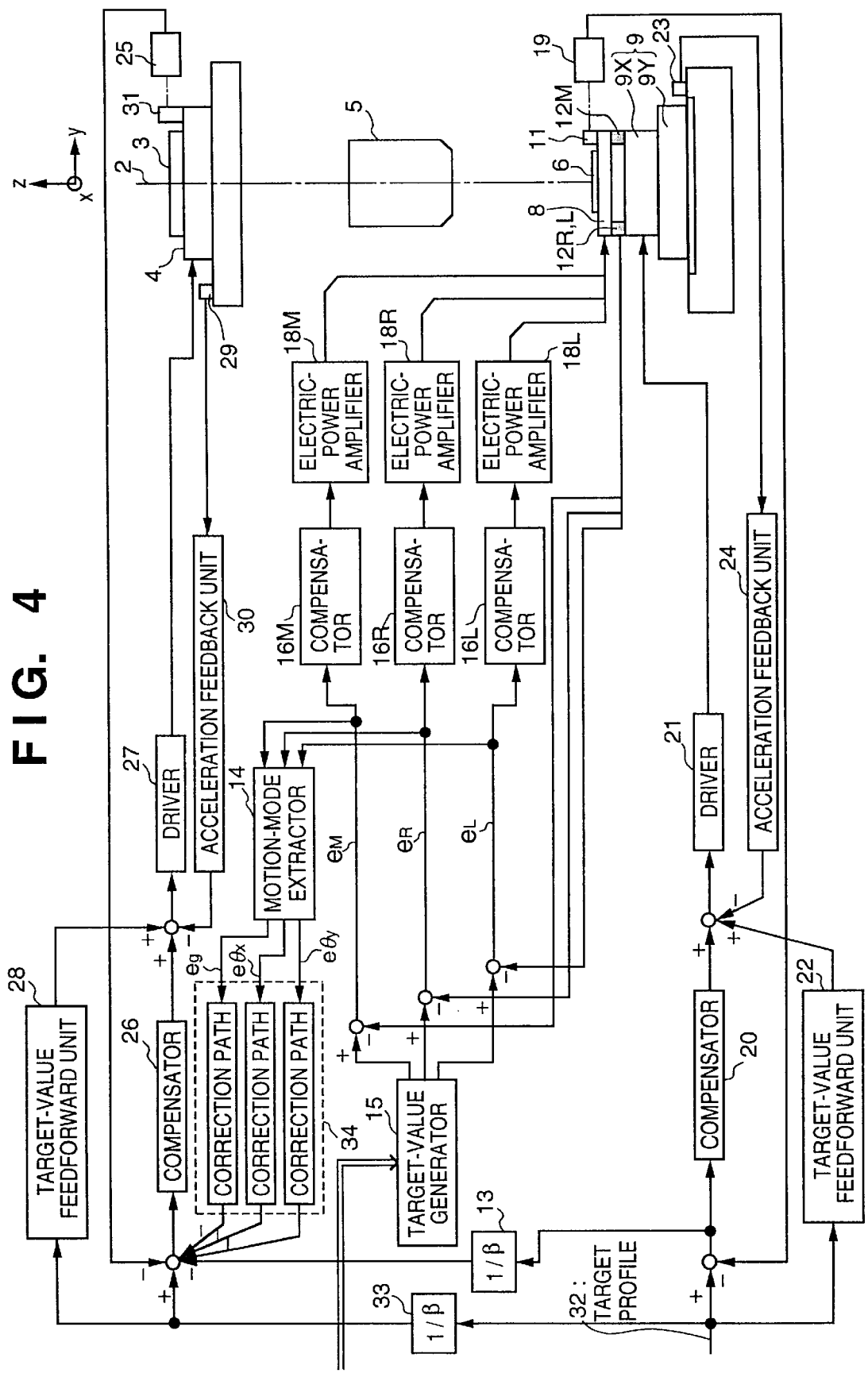
FIG. 4 is a block diagram showing the construction of the scan-projection type exposure apparatus according to a modification of the second embodiment.
Figure 5:
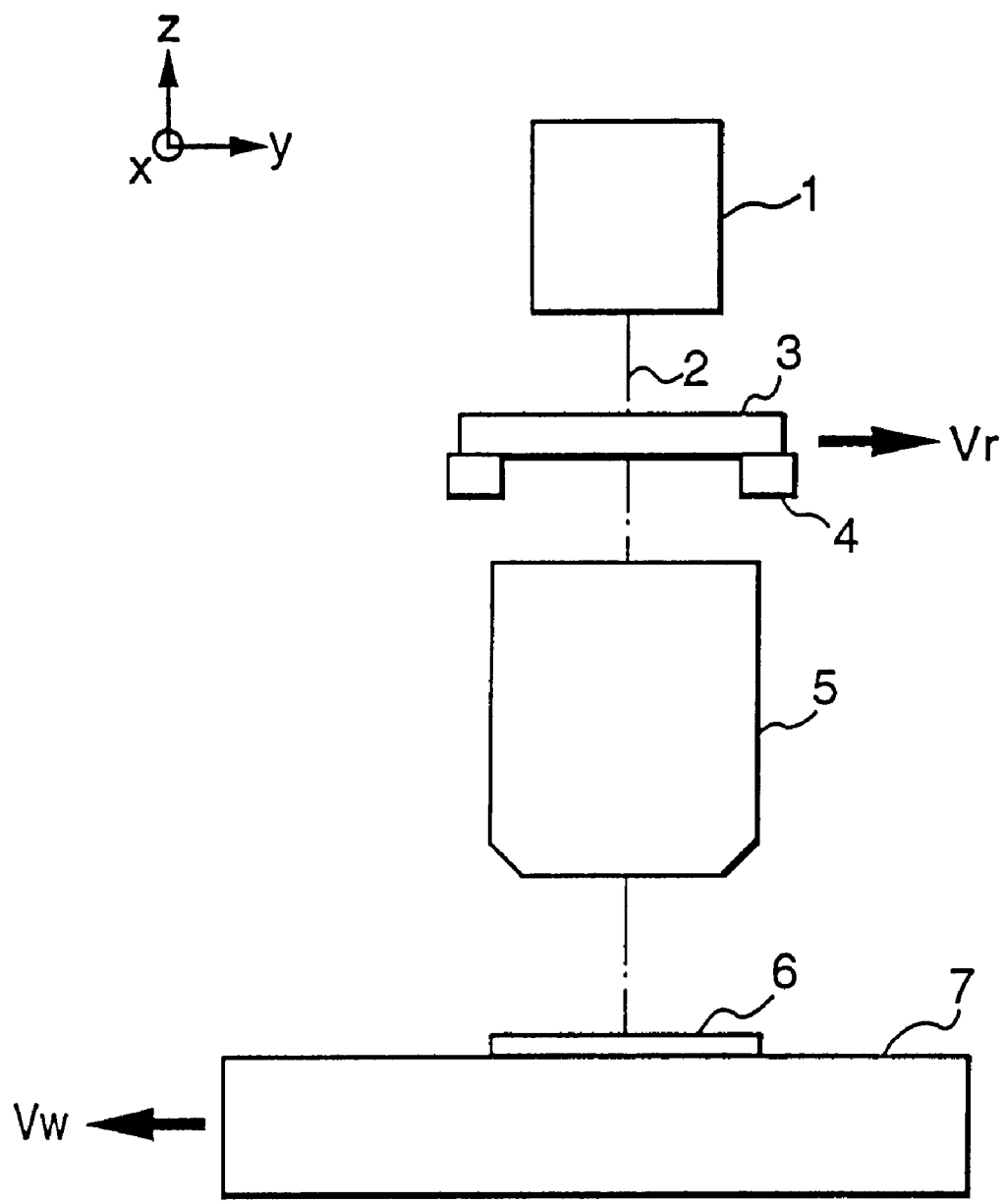
FIG. 5 is a cross-sectional view showing the conventional scan-projection type exposure apparatus.
Figure 6:
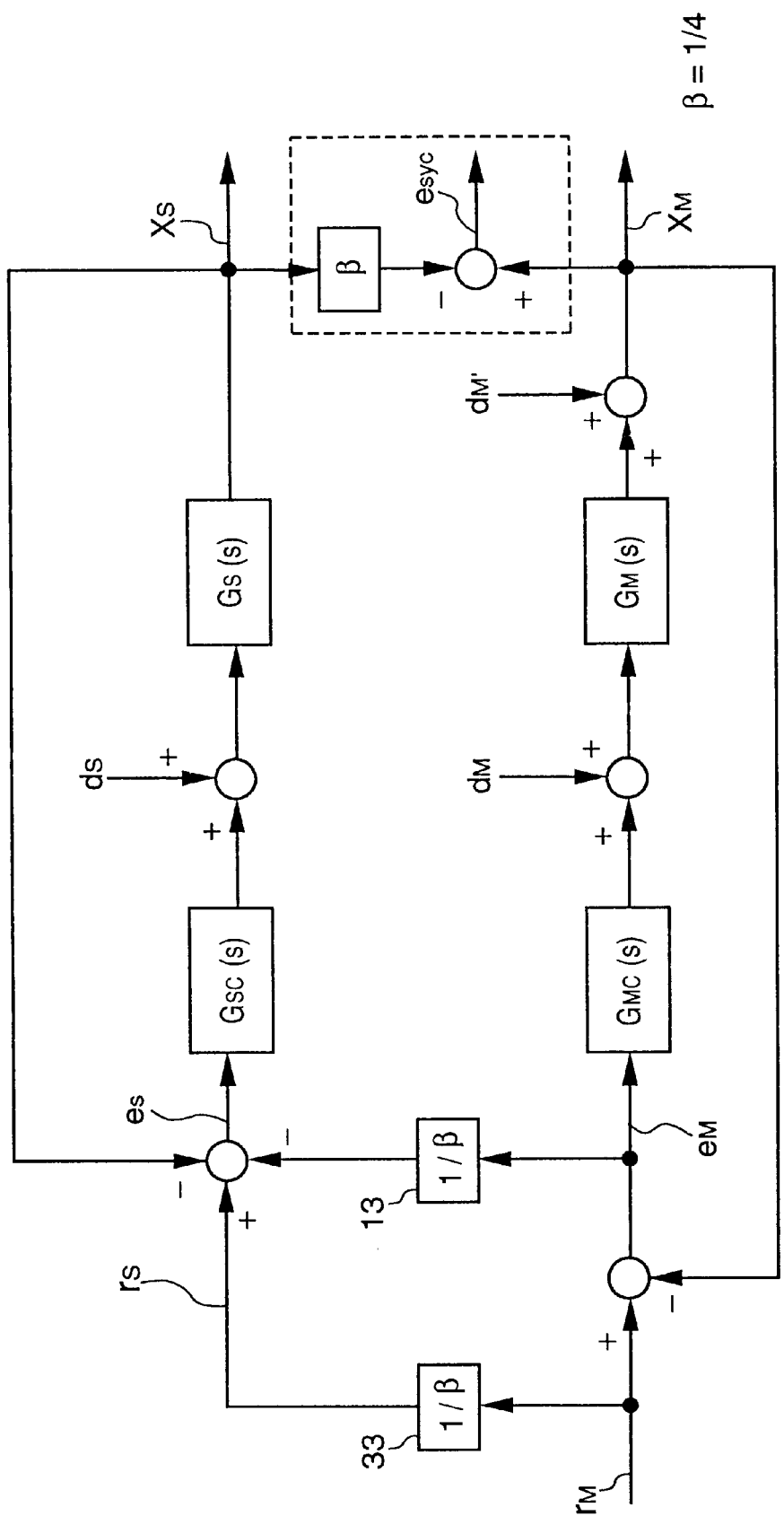
FIGS. 6 and 7 are block diagrams showing a master-slave control system.

Accordingly, the disturbance having an apparent cause can be suppressed by detecting a signal that causes the disturbance and performing correction. FIG. 1 or 3 shows a construction which detects a signal causing the disturbance $d_M'$ and performs correction on the master control system. FIG. 2 or 4 shows a construction which performs correction on the slave control system.

Hereinbelow, a scan-projection type exposure apparatus according to a first embodiment of the present invention will be described with reference to FIGS. 1 to 4.

First Embodiment

FIG. 1 shows a construction of the scan-projection type exposure apparatus according to the first embodiment. In FIG. 1, a circuit pattern on the reticle 3 is irradiated by the slit illumination area by the exposure light 2 from an optical illumination system (not shown). The pattern image is projection exposed on the wafer 6 via the optical projection system 5. At this time, the reticle 3 and that of the wafer 6 move in opposite y-axial directions.

First, the construction of an uninterference control based on movement modes with respect to the fine-motion stage 8, i.e., a position control system for the fine-motion stage 8 will be described. The construction of the position control system is explained in detail in Japanese Patent Application Laid-Open No. 7-319549 by the present applicant.

In FIG. 1, numeral 14 denotes a motion-mode extractor which inputs a signal from a displacement detection unit (not shown) for detecting displacement of the fine-motion stage 8 in a z-axial direction based on rough-motion stage 9, and extracts motion-mode signals indicative of z-axial direction translation, rotation about the x-axis, and rotation about the y-axis. The outputs from the motion-mode extractor 14 are applied to output signals from a target-value generator 15, and motion-mode error signals $e_g$, $e\theta_x$ and $e\theta_y$ are generated. The signal $e_g$ indicates the z-axial translation; the signal $e\theta_x$, the rotation about the x-axis; and the signal $e\theta_y$, the rotation about the y-axis.

The motion-mode error signals are forwarded to compensators 16G, 16X and 16Y for performing appropriate compensation on respective movement modes, and are inputted into a motion-mode distribution unit 17. The outputs from the motion-mode distribution unit 17 are inputted into electric-power amplifiers 18M, 18R and 18L for exciting the actuators 12M, 12R and 12L to drive the fine-motion stage 8. Note that the target-value generator 15 inputs a signal from a position detection unit (not shown) which detects the focal distance from the optical projection system 5 to the exposure surface of the wafer 6. In the above-mentioned Japanese Patent Application Laid-Open No. 7-319549, a piezoelectric device including a displacement expanding mechanism is employed in the actuators 12M, 12R and 12L. The present invention is not limited to such actuators, but is also applicable to electromagnetic actuators.

Next, the master control system, i.e., a position control system for the rough-motion stage 9 of the wafer stage, will be described. Note that in FIGS. 1 to 4, the rough-motion stage 9 comprises an X-stage 9X and a Y-stage 9Y. In this embodiment, as the scanning direction is on the axis y, the construction of the position control system with respect to the Y-stage 9Y will be described. Numeral 19 denotes a laser interferometer for position detection; 20, a compensator which inputs an error signal between a target profile 32 and a displacement signal from the laser interferometer 19; 21, a driver which drives an actuator to drive the Y-stage 9Y; 22, a target-value feedforward unit for improvement in response with respect to a target profile 32; 23, a vibration detector such as an accelerometer for detecting a counter force caused by quick acceleration/deceleration of the Y-stage 9Y; and 24, an acceleration feedback unit.

Finally, the slave control system, i.e., a position control system for the reticle stage 4, will be described. Numeral 25 denotes a laser interferometer for detecting the position of the reticle stage 4; 26, a compensator which inputs an error signal, obtained by subtracting a signal from the laser interferometer 25 from a signal obtained by multiplying the target profile 32 by $1/\beta$, for ensuring performance of a closed loop system; 27, a driver for driving an actuator to drive the reticle stage 4; 28, a target-value feedforward unit for improvement in response of the reticle stage; 29, a vibration detector such as an accelerometer; and 30, an acceleration feedback unit. The target profile 32 is multiplied by $1/\beta$ using a constant component 33 for driving the wafer stage 9 and the reticle stage 4 in a predetermined speed ratio. The speed ratio is determined by a projection magnification of the optical projection system.

In the scan-projection type exposure apparatus comprising the position control system for the fine-motion stage 8, the position control system for the Y-stage 9Y which scan-moves the rough-motion stage 9 carrying the fine-motion stage 8, and the position control system for the reticle stage 4, the general master-slave control method uses a synchronization correction path 13. As explained above, the synchronization correction path 13 has a function for driving the reticle stage following the wafer stage influenced by disturbance, by subtracting the error signals in the wafer-side control system with, corresponding to the disturbance applied to the wafer stage side, from the target value to the reticle stage control system, and as a result, setting the synchronization error to zero.

Note that in the embodiment shown in FIGS. 1 to 4, it may be arranged such that the synchronization correction path 13 having a constant gain $1/\beta$ further has a filter function in accordance with necessity. It may also be arranged such that the constant gain is smoothly or instantly changed in correspondence with an acceleration/deceleration operation of the wafer stage and reticle stage.

As described above, FIG. 1 shows a scan-projection type exposure apparatus which comprises the position control system for the fine-motion stage 8, the position control system for the Y-stage 9Y for the y-axial scanning of the wafer-side rough-motion stage 9 carrying the fine-motion stage 8, and the position control system for the reticle stage 4, and which employs the so-called master-slave synchronized control system that subtracts a signal, obtained from a positional error signal of the wafer-side rough-motion stage via the synchronization correction path 13, from a target value of the position control system for the reticle stage. In FIG. 1, the motion-mode error signals $e_g$, $e\theta_x$, and $e\theta_y$ in the position control system for the fine-motion stage 8 are detected, and the signals are applied to (or subtracted from) the target profile 32 of the wafer stage control system via correction paths 34.

Similar to the synchronization correction path 13, correction paths 34 respectively provide a unit having a constant gain, the constant gain having a filter function; a time-variable gain, the time-variable gain having a filter function; and a table-referring type gain, the table-referring type gain having a filter function. In a case wherein the fine-motion stage 8 is not driven around the axis x while the Y-stage 9Y of the rough-motion stage 9 is scanned, for example, there is no displacement-based disturbance to the rough-motion stage 9 caused by the x-axial rotational drive of the fine-motion stage 8. Therefore, the correction performed by the correction paths 34 are unnecessary. In this case, the gains of the correction paths 34 may be set to zero.

Second Embodiment

Next, a second embodiment will be described with reference to FIG. 2. In FIG. 1, the motion-mode error signals $e_g$, $e\theta_x$, and $e\theta_y$ of the fine-motion stage control system are detected, and the signals are added to (or subtracted from) the target profile 32 ($\times 1/\beta$) of the position control system for the wafer-side rough-motion stage (Y-stage 9Y) via the correction paths 34. This operation is made so as to correct the displacement-based disturbance given to the wafer-side rough-motion stage due to the drive of the fine-motion stage 8 by the position control system for the fine-motion stage 8. In the second embodiment, the influence of the displacement-based disturbance is absorbed by the position control system for the reticle stage. More specifically, the motion-mode error signals $e_g$, $e\theta_x$ and $e\theta_y$ of the fine-motion stage control system are detected, and the signals are added to the target value of the reticle stage via the correction paths 34.

Modifications

Next, as a modification to the first embodiment, a control with respect to the fine-motion stage 8 in consideration of the z-axial translation and the rotation about the x-axis and rotation about the y-axis, other than the motion-mode based interference control, will be considered. This control has control loops independently corresponding to the respective axes. In this case, the z-axial upward translation and the regular rotation about the y-axis of the fine-motion stage 8, for example, cannot be distinguished only by monitoring a positional error signal $e_L$. Accordingly, even if the positional error signal of the fine-motion stage 8, which is position-controlled by each axis, is taken for only one axis, one-to-one correspondence cannot be established between the positional error signal for one axis and the disturbance in fixed-speed drive of the wafer-side rough-motion stage. However, such one-to-one correspondence can be established between the motion-mode error signals $e_g$, $e\theta_x$, and $e\theta_y$ and the driving status of the fine-motion stage 8 even though the control has an axis-based structure.

FIG. 3 shows the modification to the first embodiment. In FIG. 3, different from FIG. 1 or 2, the control loops to perform the z-axial translation and the rotation about the x-axis and rotation about the y-axis independently correspond to the three axes. The signals, obtained by taking positional error signals ($e_M$, $e_R$ and $e_L$) of the respective axes from these control loops and inputting these signals into the motion-mode extraction unit 14, are the motion-mode error signals ($e_g$, $e\theta_x$ and $e\theta_y$) in one-to-one correspondence with moving amounts of the fine-motion stage 8 causing displacement-based disturbance to the rough-motion stage 9. Therefore, an advantage equivalent to that obtained in the first embodiment as shown in FIG. 1 can be attained by adding the signals in one-to-one correspondence with amounts of movement of the fine-motion stage 8 to the target value of the target profile 32 via the correction paths 34.

Similarly, as a modification to the second embodiment, a control having control loops independently corresponding to the three axes will be considered. As shown in FIG. 4, the positional error signals ($e_M$, $e_R$ and $e_L$) are obtained and inputted to the motion-mode extraction unit 14, and the motion-mode error signals ($e_g$, $e\theta_x$ and $e\theta_y$) of the fine-motion stage are calculated.

In the modification to the second embodiment, these signals are applied to the target value of the reticle stage control system via the correction paths 34. Similar to the second embodiment shown in FIG. 2, this control has a structure to correct displacement-based disturbance due to the drive of the fine-motion stage 8 by the reticle stage control system.

Note that the correction paths 34 of the scan-projection type exposure apparatus as shown in FIGS. 1 to 4 respectively have a logically or experimentally obtained constant gain, the constant gain having a filter function; a variable gain which smoothly varies in accordance with the scanning position of the wafer stage, the variable gain having a filter function; and a variable gain which can be changed in accordance with a scanning position of the wafer stage, or a variable gain having a filter function. For example, if the fine-motion stage 8 is not driven to rotate around the axis x while the wafer stage is scanned, from the point of exposure capability, the gains of the correction paths 34 regarding the x-axial motion-mode error signal $e\theta_x$ are set to zero.

Further, when the fine-motion stage 8 is rotated around the axis z, the wafer-side rough-motion stage receives displacement-based disturbance. FIGS. 1 to 4 lack position control means for rotating the fine-motion stage 8 around the axis z, and do not clearly show synchronization correction means. However, it is apparent that the correction paths 34 can be constructed so as to input the motion-mode error signals ($e_g$, $e\theta_x$ and $e\theta_y$) of the fine-motion stage 8 and an error signal $e\theta_z$ of a z-axial rotation mode.

As described above, the first embodiment corrects a target value of the position control system for the wafer-side rough-motion stage as the master control system, with the respective motion-mode error signals one-to-one corresponding to the disturbance of the wafer-side rough-motion stage due to the drive of the fine-motion stage. This quickly suppresses the synchronization error between the wafer and the reticle.

Further, the second embodiment corrects a target value of the position control system of the reticle stage as the slave control system, with the respective motion-mode error signals one-to-one corresponding to the disturbance of the wafer-side rough-motion stage due to the drive of the fine-motion stage. This quickly suppresses the synchronization error between the wafer and the reticle.

Further, the modification to the first embodiment has a similar advantage to that of the first embodiment, and the modification to the second embodiment also has a similar advantage to that of the second embodiment.

The advantages of the scan-projection type exposure apparatus according to the present invention are as follows.
(1) Disturbance in constant-speed drive of a wafer-side rough-motion stage, due to translation and/or rotation of a fine-motion stage, which causes a disturbance in the synchronization with respect to a reticle stage. The scan-projection type exposure apparatus of the present invention has new correction paths for correcting a target value of a control system of the wafer-side rough-motion stage or the reticle stage with signals within the fine-motion stage control system. This quickly suppresses the synchronization error between the wafer and the reticle stage due to the movement of the fine-motion stage.
(2) The signals in the fine-motion stage control system inputted into the new correction paths are motion-mode error signals in one-to-one correspondence with speed variations of the wafer-side rough-motion stage due to the drive of the fine-motion stage. Accordingly, the correction paths newly added from the fine-motion stage control system to the wafer stage or reticle stage have a simple construction.
(3) The scan-projection type exposure apparatus in FIGS. 1 to 4 has correction paths which positively suppress displacement-based disturbance having a clear cause-and-effect relation, due to drive of the fine-motion stage, based on a so-called master-slave synchronized control system, wherein the wafer stage is regarded as a master, and the reticle stage is regarded as a slave. This quickly suppresses the synchronization error.

As many apparently widely different embodiments of the present invention can be made without departing from the spirit and scope thereof, it is to be understood that the invention is not limited to the specific embodiments thereof except as defined in the appended claims.

What is claimed is:

1. A stage-drive control apparatus comprising:
   first moving means for moving a first stage based on a given target value;
   second moving means for moving a second stage in synchronization with movement of said first stage by said first moving means;
   control means for controlling displacement of a third stage, provided on said first stage, with respect to said first stage; and
   correction means for correcting a control signal of at least one of said first moving means and said second moving means based on a control signal for said third stage from said control means.

2. The stage-drive control apparatus according to claim 1, wherein said first moving means controls the movement of said first stage based on a positional error obtained from the target value and a position of said first stage,
   and wherein said correction means corrects the positional error of said first moving means based on the control signal for said third stage from said control means.

3. The stage-drive control apparatus according to claim 1, where in s aid second moving means controls said second stage based on a positional error obtained from a target value, obtained by correcting the target value at a predetermined ratio, and a position of said second stage,
   and wherein said correction means corrects the positional error of said second moving means based on the control signal for said third stage from said control means.

4. The stage-drive control apparatus according to claim 1, further comprising synchronization correction means for correcting the positional error, obtained from the target value of said first moving means and the position of said first stage, at a predetermined ratio, and correcting a control amount of said second moving means by using the corrected positional error.

5. The stage-drive control apparatus according to claim 1, wherein said control means controls drive of said third stage based on a positional error obtained from a designated target value and a displacement amount of said third stage,
   and wherein said correction means corrects the control signal of at least one of said first stage and said second stage based on the positional error obtained by said control means.

6. The stage-drive control apparatus according to claim 1, wherein said control means constructs control loops independently corresponding to respective motion axes,
   and wherein said correction means corrects the control signal of at least one of said first stage and said second stage based on positional errors of the respective motion axes.

7. A stage-drive control method comprising:
   a first moving step of moving a first stage based on a given target value;
   a second moving step of moving a second stage in synchronization with movement of the first stage in said first moving step;

a control step of controlling displacement of a third stage, provided on the first stage, with respect to the first stage; and a correction step of correcting a control signal of at least one of said first moving step and said second moving step based on a control signal for the third stage generated in said control step.

8. The stage-drive control method according to claim 7, wherein said first moving step comprises controlling movement of the first stage based on a positional error obtained from the target value and a position of the first stage, and said correction step comprises correcting the positional error used in said first moving step based on the control signal for the third stage obtained in said control step.

9. The stage-drive control method according to claim 7, wherein said second moving step comprises controlling the second stage based on a positional error obtained from a target value, obtained by correcting the target value in a predetermined ratio, and a position of the second stage, and said correction step comprises correcting the positional error used in said second moving step based on the control signal for the third stage obtained in said control step.

10. The stage-drive control method according to claim 7, further comprising a synchronization correction step of correcting the positional error, obtained from the target value of said first moving step and the position of the first stage, in a predetermined ratio, and correcting a control amount of said second moving step by using the corrected positional error.

11. The stage-drive control method according to claim 7, wherein said control step comprises controlling drive of the third stage based on a positional error obtained from a designated target value and a displacement amount of the third stage, and said correction step comprises correcting the control signal of at least one of the first stage and the second stage based on the positional error obtained in said control step.

12. The stage-drive control method according to claim 7, wherein said control step comprises arranging control loops independently corresponding to respective motion axes for controlling displacement of the third stage, and said correction step comprises correcting the control signal of at least one of the first stage and the second stage based on positional errors of the respective motion axes.

13. A scan-projection type exposure apparatus having a reticle stage which scan-moves a reticle in a predetermined direction, and a wafer stage which scan-moves a wafer in synchronization with movement of the reticle stage, with respect to an exposure area in conjugation with an illumination area on the reticle, said apparatus projecting a circuit pattern on the reticle onto the wafer and, comprising:

first moving means for controlling movement of a rough-motion stage of said wafer stage;

second moving means for moving said reticle stage in synchronization with movement of said wafer stage;

position control means for positioning a fine-motion stage, provided in said wafer stage, carrying the wafer, at a predetermined degree of freedom; and correction means for correcting a target value of at least one of said first moving means and said second moving means based on a control amount with respect to said fine-motion stage by said position control means.

14. The scan-projection type exposure apparatus according to claim 13, further comprising synchronization correction means for correcting a positional error amount of said first moving means in a ratio determined by a projection magnification of an optical projection system forming the illumination area and the exposure area, and correcting a target value of said second moving means based on the corrected positional error amount.

15. The scan-projection type exposure apparatus according to claim 13, wherein said position control means comprises control loops independently corresponding to respective motion axes, and wherein said correction means corrects the target value of at least one of said first moving means and said second moving means based on positional error amounts corresponding to the respective motion axes.

16. The scan-projection type exposure apparatus according to claim 15, wherein said correction means applies the positional error amounts corresponding to the respective motion axes to the target value of at least one of said first moving means and said second moving means via correction paths provided for the respective positional error amounts, and wherein the correction paths respectively have a constant gain, the constant gain having a filter function, a variable gain which varies in accordance with a position of said wafer stage, or the variable gain having a filter function.

* * * * *

UNITED STATES PATENT AND TRADEMARK OFFICE
CERTIFICATE OF CORRECTION

PATENT NO. : 5,900,707

DATED : May 4, 1999

INVENTOR : SHINJI WAKUI

It is certified that error appears in the above-identified patent and that said Letters Patent is hereby corrected as shown below:

COLUMN 6:

line 11, "projection exposed" should read --projection-exposed--.

COLUMN 7:

line 61, "correction" should read --corrections--.

COLUMN 8:

line 1, "e0$_x$," should read --e$\theta_x$--; and
line 34, "e0$_x$," should read --e$\theta_x$--.

COLUMN 10:

line 32, "where in s aid" should read --wherein said--.

UNITED STATES PATENT AND TRADEMARK OFFICE
CERTIFICATE OF CORRECTION

PATENT NO. : 5,900,707

DATED : May 4, 1999

INVENTOR : SHINJI WAKUI

It is certified that error appears in the above-identified patent and that said Letters Patent is hereby corrected as shown below:

COLUMN 12:

line 7, "and," should read --and--.

Signed and Sealed this

Seventh Day of December, 1999

Attest:

Q. TODD DICKINSON

*Attesting Officer*     Acting Commissioner of Patents and Trademarks